(12) United States Patent
Cote

(10) Patent No.: US 11,085,965 B2
(45) Date of Patent: Aug. 10, 2021

(54) CLOCK GATING AND SCAN CLOCK GENERATION FOR CIRCUIT TEST

(71) Applicant: Mentor Graphics Corporation, Wilsonville, OR (US)

(72) Inventor: Jean-Francois Cote, Davie, FL (US)

(73) Assignee: Siemens Industry Software Inc., Plano, TX (US)

(*) Notice: Subject to any disclaimer, the term of this patent is extended or adjusted under 35 U.S.C. 154(b) by 8 days.

(21) Appl. No.: 16/670,146

(22) Filed: Oct. 31, 2019

(65) Prior Publication Data

US 2020/0141999 A1    May 7, 2020

Related U.S. Application Data

(60) Provisional application No. 62/754,032, filed on Nov. 1, 2018.

(51) Int. Cl.
*G01R 31/3177* (2006.01)
*G01R 31/317* (2006.01)

(52) U.S. Cl.
CPC ... *G01R 31/3177* (2013.01); *G01R 31/31723* (2013.01); *G01R 31/31725* (2013.01)

(58) Field of Classification Search
CPC .......... G01R 31/3177; G01R 31/31723; G01R 31/31725; G01R 31/318552
See application file for complete search history.

(56) References Cited

U.S. PATENT DOCUMENTS 9,013,208 B1* 4/2015 Rosen ................. H03K 19/096
326/40
2018/0076803 A1* 3/2018 Liau ........................ H03K 5/15

* cited by examiner

*Primary Examiner* — Thien Nguyen

(57) ABSTRACT

A circuit comprises a clock gating device. The clock gating device comprises a multiplexing device and circuitry for generating multiplexer input signals. The selector input of the multiplexing device is coupled to a clock signal. The multiplexing device selects the first input signal to send to an output of the multiplexing device when the selector input is set to "0" and selects the second input signal to send to the output of the multiplexing device outputted when the selector input is set to "1". The circuitry for generating multiplexer input signals is configured to ensure the timing of the transitions on the output are derived from the timing of the transitions of the clock signal and not by the timing of the transition of the first and second inputs of the multiplexing device.

14 Claims, 8 Drawing Sheets

CLOCK GATING AND SCAN CLOCK GENERATION FOR CIRCUIT TEST

RELATED APPLICATIONS

This application claims the benefit of U.S. Provisional Patent Application No. 62/754,032, filed on Nov. 1, 2018, which application is incorporated entirely herein by reference.

FIELD OF THE DISCLOSED TECHNIQUES

The presently disclosed techniques relates to clock gating and scan clock generation. Various implementations of the disclosed techniques may be particularly useful for testing multiple cores of a circuit having clock mesh architecture.

BACKGROUND OF THE DISCLOSED TECHNIQUES

An integrated circuit often takes multiple steps to perform a function, and uses an electrical signal known as a "system clock" to pace how quickly each of these steps is performed. The higher the frequency of the system clock pulses, the faster the integrated circuit will operate. A clock (also referred to as "a clock signal") has a period that specifies the duration of a repeated high and low pattern. The period is inversely related to the clock frequency. The duty cycle of the clock is the ratio of high to low time in the period, usually 50%.

An integrated circuit can have multiple system clocks for simultaneously performing multiple tasks. Different system clocks can control different portions or regions of an integrated circuit. Such regions are referred to as clock domains. As integrated circuits grow to include billions of transitions, it is virtually impossible to design them flat (with no partitioning). Electronic Design Automation (EDA) tools would not be able to process them efficiently. Additionally, there is significant reuse of Intellectual Property (IP) from one design to another. Large designs, known as Systems-On-A-Chip (SOCs), include a large number of "cores" that are used as building blocks (also referred to circuit blocks). Each core can have one or more clock domains.

Circuit defects are unavoidable no matter whether the manufacturing process is at the prototype stage or the high-volume manufacturing stage. It is thus necessary to test chips during the manufacturing process. Structural testing attempts to ascertain that the circuit-under-test has been assembled correctly from some low-level building blocks as specified in a structural netlist and that these low-level building blocks and their wiring connections have been manufactured without defect. Scan testing is the most common technique of structural testing. Under this technique, a series of known values (test stimuli or test pattern) are shifted-in (or loaded into) state elements called scan cells through their sequential inputs. These scan cells are interconnected into scan chains for scan testing. The shifting-in occurs by placing the integrated circuit in a special mode, known as shift mode, and then applying a series of clock pulses, called "shift pulses" or "shift clock pulses." Each shift clock pulse pushes a bit of test stimuli into a scan cell in each of the scan chains. This continues until all scan cells in the scan chains are filled with test pattern bits.

Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" and stored in the scan cells. The circuit then returns to shift mode, and with each additional clock pulse, a bit of the test responses is pushed or shifted out as each bit of new test pattern is pushed or shifted in. The shifted out test responses are then compared with expected results to determine and locate any errors. Shift mode and capture mode together may be called as test mode.

Shift clock pulses and capture clock pulses can be derived from a system clock signal. To reduce power dissipation, the frequency of shift clock pulses is often kept lower than the system clock signal, for example, a frequency between 20 MHz and 100 MHz vs. several GHz. If a circuit block under test has a single clock entry point for a system clock using clock tree technology, on-chip clock control circuitry for deriving shift clock pulses and capture clock pulses from the system clock can be inserted at the clock entry point. At advanced technology nodes, the manufacturing process exhibits multiple sources of on-chip variations effects. Clock mesh technology provides uniform, low skew clock distribution and offers better tolerance to on-chip variations than clock tree technology. In clock mesh technology, each circuit block can have hundreds or even thousands of balanced clock entry points. Shift clock pulses and capture clock pulses need be generated at the base of the clock mesh if conventional technology is employed. This arrangement, however, prevents multiple cores receiving the same system clock signal from being tested independently.

BRIEF SUMMARY OF THE DISCLOSED TECHNIQUES

Various aspects of the disclosed technology relate to clock gating and scan clock generation. In one aspect, there is a circuit, comprising: a clock gating device, comprising: a multiplexing device, wherein a selector input of the multiplexing device is coupled to a clock signal; and circuitry for generating multiplexer input signals configured to generate, and to send to inputs of the multiplexing device, a first input signal which does not change when the selector input is at "0" and a second input signal which does not change when the selector input is at "1", wherein the multiplexing device selects the first input signal to send to an output of the multiplexing device when the selector input is set to "0" and selects the second input signal to send to the output of the multiplexing device outputted when the selector input is set to "1".

The circuitry for generating multiplexer input signals may receive a shift clock enable signal and a capture clock enable signal and generate the first input signal and the second input signal based at least in part on the shift clock enable signal and the capture clock enable signal, and the output of the multiplexing device may comprise clock pulses for scan shift and scan capture, respectively.

The circuitry for generating multiplexer input signals may comprise logic gates and latches which generate the first input signal and the second input signal based on a third signal and a fourth signal, and the output of the multiplexing follows the clock signal when the third signal is at "1" and the fourth signal is at either "0" or "1", is set to "0" when both the third signal and the fourth signal are at "0", and is set to "1" when the third signal is at "0" and the fourth signal are at "1". The third signal and the fourth signal may be generated by a device based on scan clock control signals comprising a shift clock enable signal and a capture clock enable signal. The device may be in the clock gating device or outside the clock gating device. The device may supply the third signal and the fourth signal to multiple instances of the clock gating device in the circuit.

The circuit may further comprise: a plurality of circuit blocks, and clock mesh circuitry configured to provide the clock signal to each of the plurality of circuit blocks through a plurality of clock entry points, wherein each of the plurality of clock entry points is coupled to an instance of the clock gating device directly or indirectly.

In another aspect, there are one or more non-transitory computer-readable media storing computer-executable instructions for causing one or more processors to perform a method, the method comprising: creating the above clock gating device in a circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed technology relate to clock gating and scan clock generation. In the following description, numerous details are set forth for the purpose of explanation. However, one of ordinary skill in the art will realize that the disclosed technology may be practiced without the use of these specific details. In other instances, well-known features have not been described in detail to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "couple" and "generate" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Figure 1:
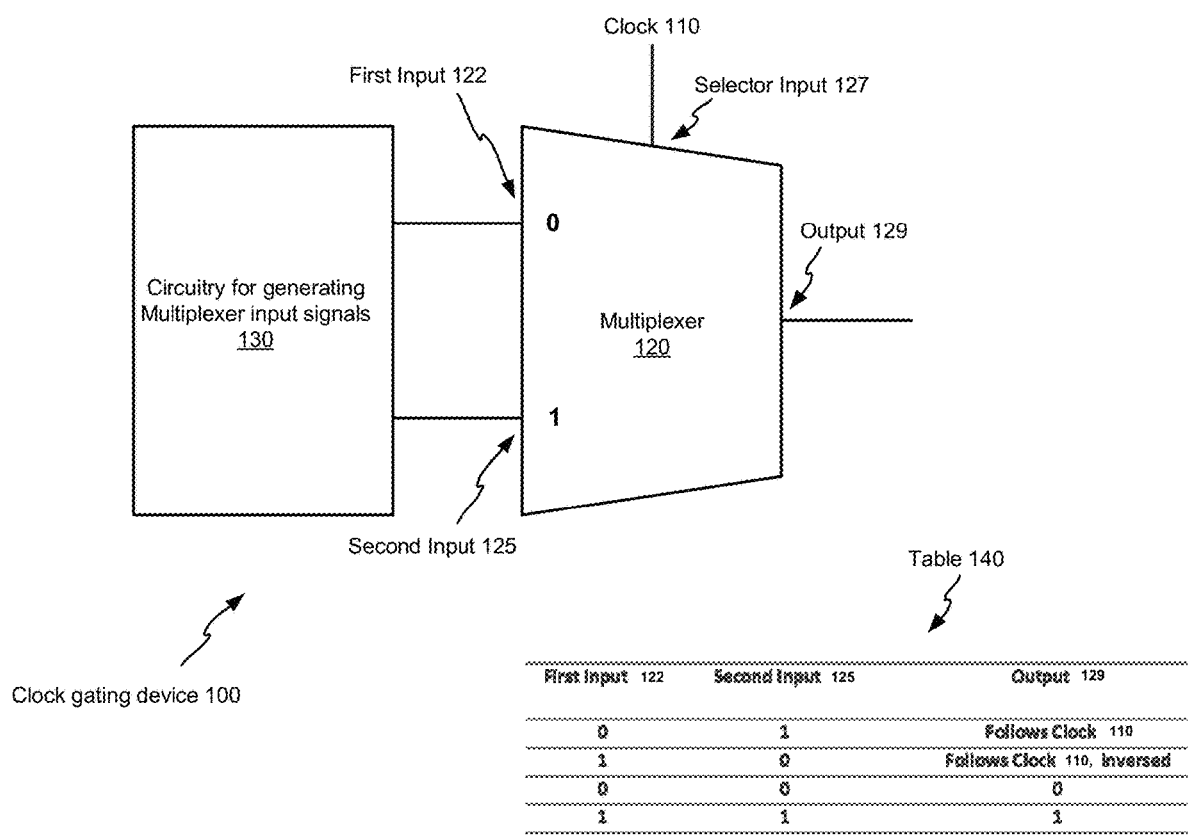
FIG. 1 illustrates an example of a block diagram for a clock gating device according to various embodiments of the disclosed technology.

FIG. 1 illustrates an example of a block diagram for a clock gating device 100 according to various embodiments of the disclosed technology. The clock gating device 100 comprises a multiplexing device 120 and circuitry for generating multiplexer input signals 130. The multiplexing device 120 is a device that selects between signals at two inputs (a first input 122 and a second input 125) based on a signal at a selector input 127, and forwards it to an output 129. In contrast to conventional uses of a multiplexer, the selector input 127 of the multiplexing device 120 is coupled to a clock signal 110, which can to be gated or used to generate a slow clock signal such as a clock signal including scan shift and capture pulses.

FIG. 1 also illustrates a truth table 140 describing how the multiplexing device 120 operates. When the two inputs 122 and 125 are kept at different logic values, either "1" for one and "0" for the other or the opposite, the output 129 either follows the clock signal 110 or sends out an inverse copy of the clock signal 110. When both of the inputs 122 and 125 are kept at "0", the output 129 is also kept at "0" and thus the clock signal 110 is gated off or disabled. When both of the inputs 122 and 125 are kept at "1", the output 129 is also kept at "1". By keeping the inputs 122 and 125 alternatively at "1" for a number of clock periods of the clock signal 110 and at "0" for the same number of clock periods of the clock signal 110, the multiplexing device 120 can output clock pulses which are slower than the clock signal 110 and have a duty cycle about 50%.

The ability to generate a slow clock with a 50% duty cycle is particularly useful for scan test because both rising and falling edges of a clock pulse are often used for scan shift. A conventional clock gater can generate slow clock pulses from a fast system clock signal, but the duty cycle can be very low. For example, an AND gate-based clock gater allows original clock pulses (1 GHz) to pass through once every 20 clock pulses. The resulted output clock signal is at 50 MHz, twenty times slower than the original one. While this is a typical frequency for scan shift, the duty cycle is only about 2.6%, which can cause timing problems for scan shift. A similar result will be obtained if the multiplexing device 120 is used as a conventional clock gating device with the clock signal 110 coupled to one of its two inputs.

Figure 2:
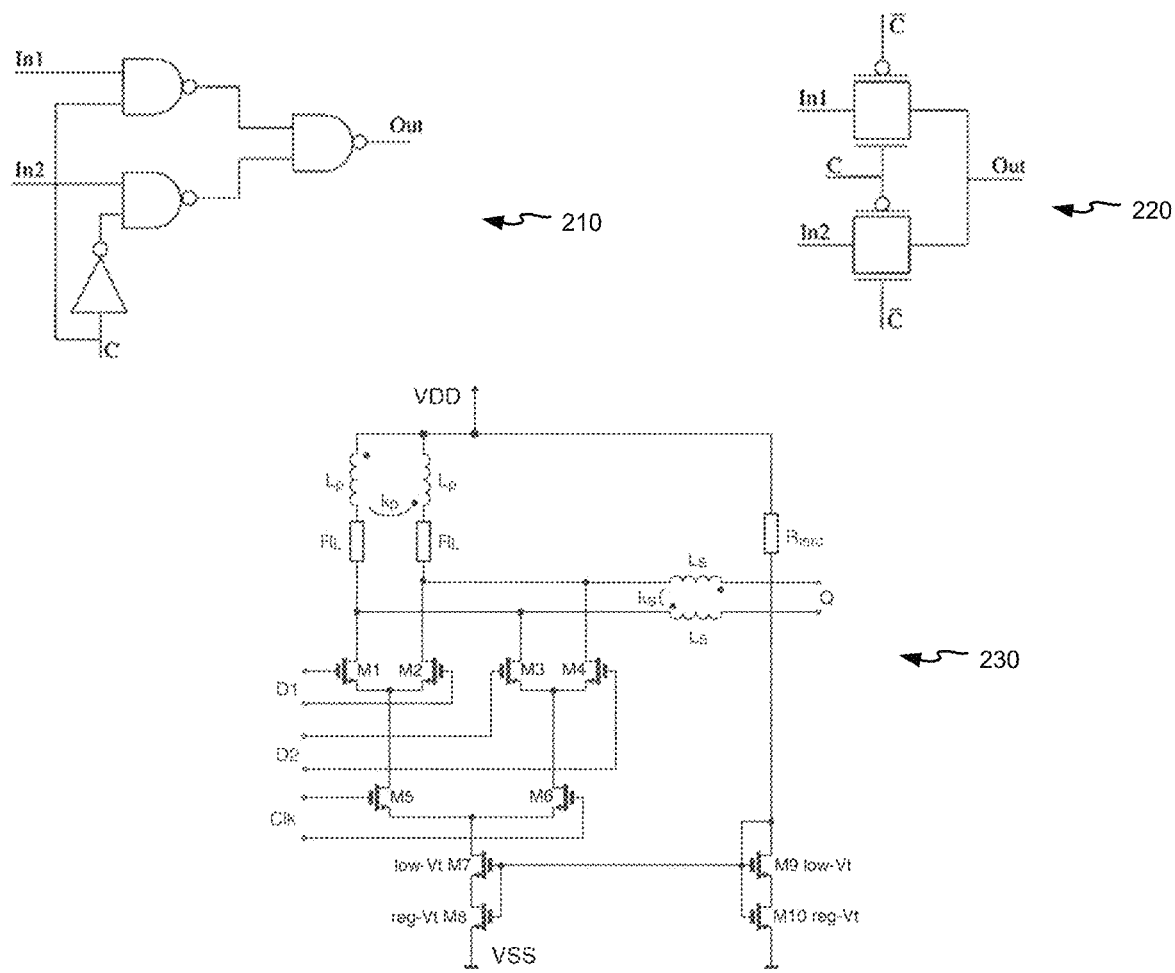
FIG. 2 illustrates examples of conventional multiplexers that may be employed to implement the multiplexing device in a clock gating device according to various embodiments of the disclosed technology.

The multiplexing device 120 can be implemented with a conventional multiplexer. FIG. 2 shows examples of conventional multiplexers that may be employed to implement the multiplexing device 120 according to various embodiments of the disclosed technology. Multiplexers 210 and 220 are illustrated at gate level while a multiplexer 230 is shown at transistor level. The multiplexer 210 comprises AND gates while the multiplexer 220 comprises a pair of tri-state gates.

Refer back to FIG. 1. The circuitry for generating multiplexer input signals 130 is configured to generate a first input signal and a second input signal and to send them to the first input 122 and second input 125 of the multiplexing device 120, respectively. The first input signal does not change when the selector input 127 is at "0" and the second input signal does not change when the selector input 127 is at "1". This can prevent unpredictable states at the output 129. This makes sure that the transitions on the output 129 are timed from the transitions on the clock signal 110.

Figure 3:
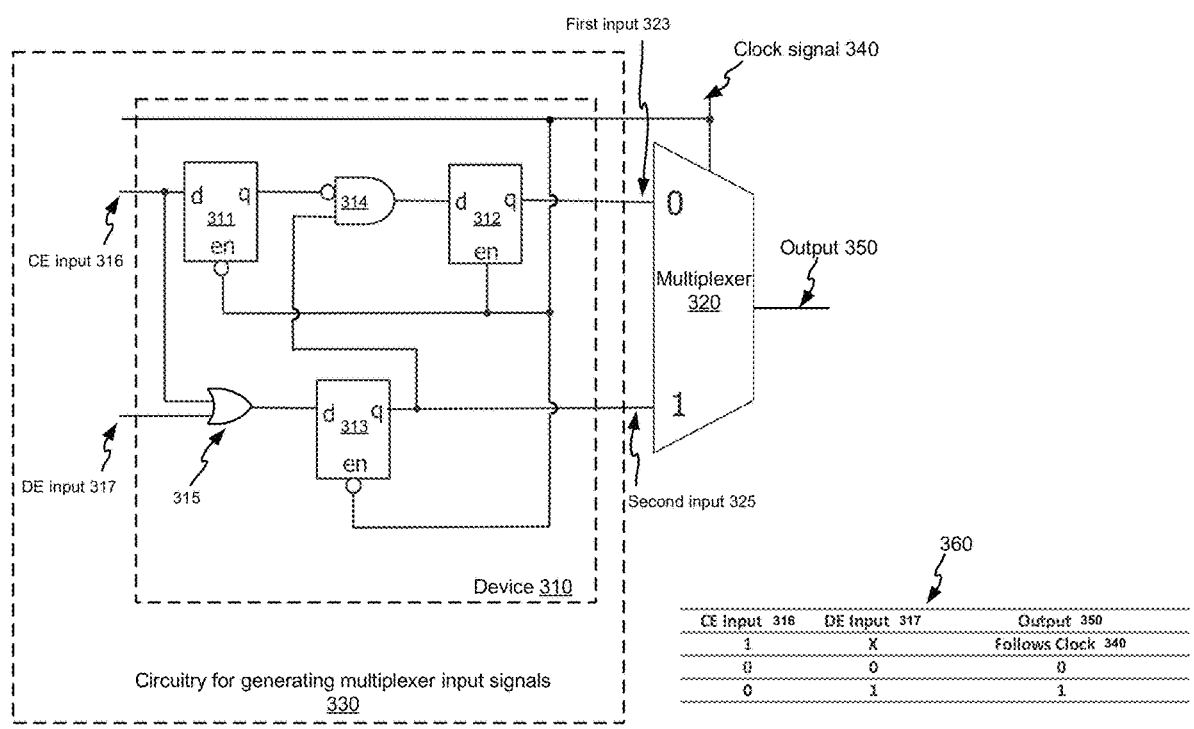
FIG. 3 illustrates an example of a block diagram for the circuitry for generating multiplexer input signals according to various embodiments of the disclosed technology.

FIG. 3 illustrates an example of a block diagram for circuitry for generating multiplexer input signals 330 according to various embodiments of the disclosed technology. The circuitry for generating multiplexer input signals 330 comprises a device 310. The device 310 comprises latches 311, 312 and 313, an AND gate 314, and an OR gate 315. A clock signal 340 is coupled to a selector input of a multiplexer 320 and also drives enable/clock inputs of the latches 311, 312 and 313. Here, the latches 311 and 313 updates their outputs only when the clock signal 340 is at "0" while the latch 312 changes its state only when the clock signal 340 is at "1". This arrangement helps ensure that the first input 323 does not change when the clock signal 340 is at "0" and the second input 325 does not change when the clock signal 340 is at "1".

When a CE input 316 of the device 310 is set at "1", the first and second inputs 323, 325 of the multiplexer 320 will be set at "0" and "1", respectively, regardless of whether a DE input 317 is at either "0" or "1". As such, an output 350 of the multiplexer 320 will follow the clock signal 340. When both of the CE input 316 and the DE input 317 are set at "0", both of the first input 323 and the second input 325 are also set at "0" and thus the output 350 will be "0". When the CE input 316 is at "0" and the DE input 317 is at "1", both of the first input 323 and the second input 325 are set at "1" and thus the output 350 will be at "1". The above is summarized in a truth table 360.

Figure 4:
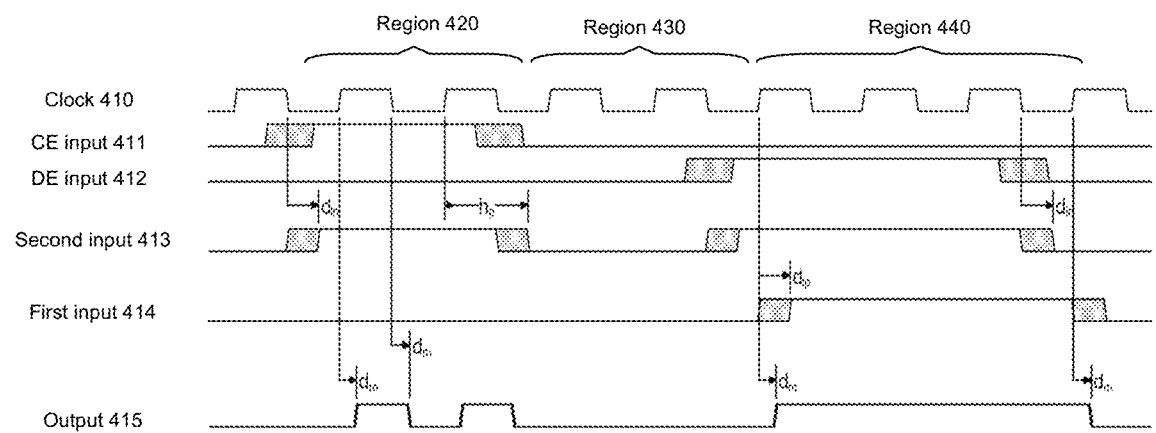
FIG. 4 illustrates an example of waveforms for the clock signal and the signals at the CE input, the DE input, the first input, the second input, and the output for the circuit shown in FIG. 3.

FIG. 4 illustrates an example of waveforms for signals of the clock gating device shown in FIG. 3. Specifically, waveforms for a clock signal 410 and signals at the CE input 411, the DE input 412, the first input 414, the second input 413, and the output 415 are displayed. In the figure, the second input 413 changes only when the clock signal 410 is at "0", and the first input 414 changes only when the clock signal 410 is at "1". In region 420, the output 415 follows the clock signal 410 because the CE input 411 is at "1". Two pulses of the clock signal 410 is thus allowed to pass through the multiplexer 320. In region 430, the output 415 is at "0" because both the CE input 411 and the DE input 412 are at "0". As such, the clock signal 410 is gated off during this period. In region 440, the output 415 is kept at "1" for about three clock pulses of the clock signal 410 because the CE input 411 is at "0" and the DE input 412 is at "1". The output 415 then returns to "0". If it the output 415 is kept at "0" for three clock period of the clock signal 410 before changes back to "1" and this pattern of alternating between "1" and "0" every three clock periods repeats itself, a slow clock pulses (one third of the frequency of the clock 410) with 50% duty cycle will be generated. These slow clock pulses can be used as scan shift clock pulses. The "at-speed" clock pulses such as the two clock pulses in the region 420 can be used as scan capture clock pulses.

A person of ordinary skill in the art would appreciate that the device 310 shown in FIG. 3 is just an example, and that a different device may be used to generate signals for the two inputs of the multiplexing device according to various embodiments of the disclosed technology.

Figure 5:
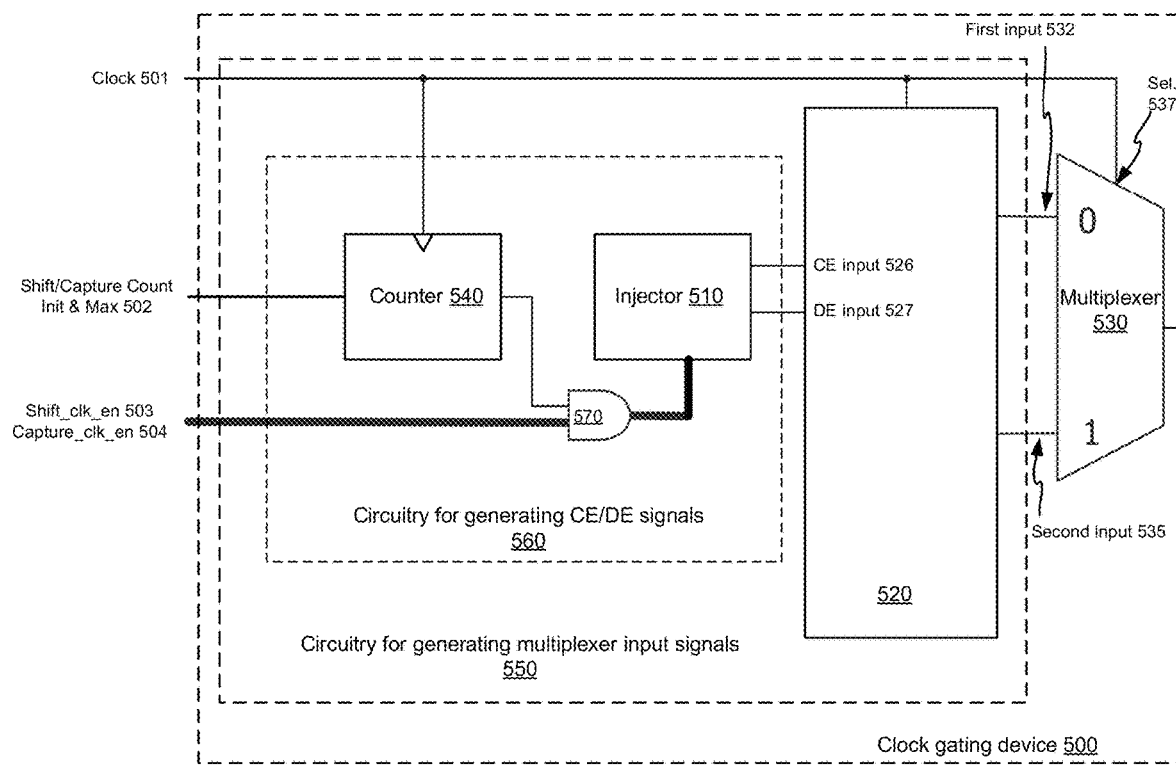
FIG. 5 illustrates an example of a block diagram for a clock gating device which can generate clock pulses for scan shift and scan capture based on scan clock control signals according to various embodiments of the disclosed technology.

FIG. 5 illustrates an example of a block diagram for a clock gating device 500 which can generate clock pulses for scan shift and scan capture based on scan clock control signals according to various embodiments of the disclosed technology. Like the clock gating device 100 shown in FIG. 1, the clock gating device 500 comprises a multiplexing device 530 and circuitry for generating multiplexer input signals 550. Unlike the circuitry for generating multiplexer input signals 330 in FIG. 3, the circuitry for generating multiplexer input signals 550 is shown to comprise not only a device 520 but also circuitry for generating CE/DE signals 560. The device 520 generates signals for a first input 532 and a second input 535 of the multiplexing device 530 based on CE and DE signals received at a CE input 526 and a DE input 527, respectively. An example of the device 520 is the device 310 shown in FIG. 3. A clock signal 501 is coupled to a selector input 537 of the multiplexing device 530, and also drives the device 520.

The circuitry for generating CE/DE signals 560 comprises a counter device 540, an injector device 510 and a gating device 570. It generates the CE and DE signals based on a shift clock enable signal 503 and a capture clock enable signal 504. The shift clock enable signal 503 and the capture clock enable signal 504 may be generated by a test controller such as a logic BIST (built-in self-test) controller. The counter device 540 is driven by the clock signal 501 and generates clock pulses based on preset shift pulse count initial & maximum numbers and capture pulse count initial & maximum numbers 502. The gating device 570 uses these generated clock pulses to gate the shift clock enable signal 503 and the capture clock enable signal 504. The injector 510 then generates the CE and DE signals based on the output of the gating device 570. It should be noted that additional clock control signals such as a test compression clock enable signal for a test compression controller may be supplied to the gating device 570. The clock gating device 500 can generate clock pulses for the test compression controller based on the test compression clock enable signal. The circuitry for generating CE/DE signals 560 allows the scan clock control signals such as the shift clock enable signal 503 and the capture clock enable signal 504 to be transported through multicycle paths rather than through pipeline paths.

Figure 6:
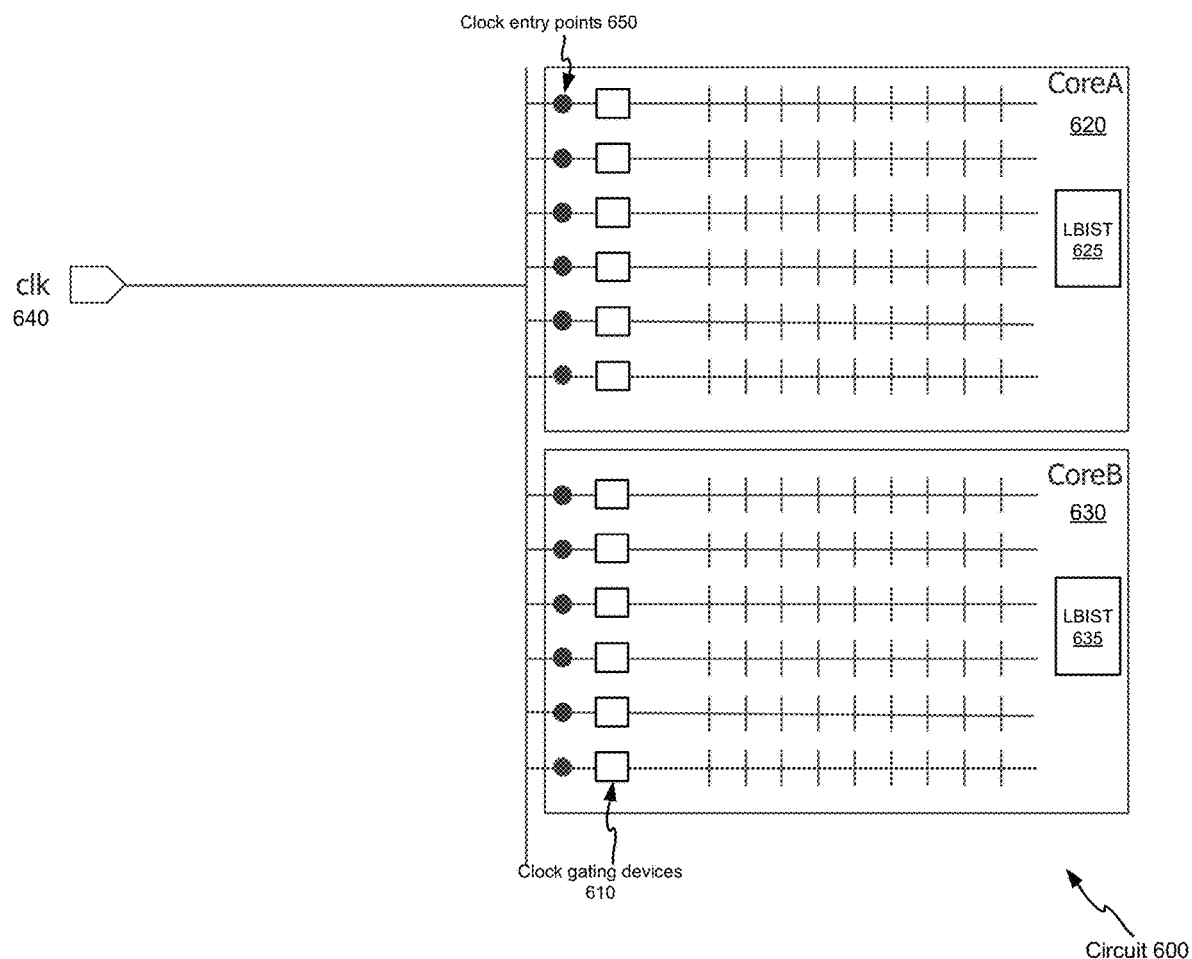
FIG. 6 illustrates an example of a circuit utilizing the clock gating devices in clock mesh architecture according to various embodiments of the disclosed technology.

FIG. 6 illustrates an example of a circuit 600 utilizing clock gating devices 610 in clock mesh architecture according to various embodiments of the disclosed technology. The circuit 600 comprises two circuit blocks 620 and 630 and a system clock signal 640. The clock signal 640 enters each of the circuit blocks 620 and 630 through multiple clock entry points 650. The clock gating devices 610 are inserted after the clock entry points 650. The clock gating devices 610 may be implemented by the clock gating device 500 shown in FIG. 5 to generate clock signals for scan test in a test mode. The circuit blocks 620 and 630 comprise logic BIST controllers 625 and 635, respectively. Each of the logic BIST controllers 625 and 635 can generate a shift clock enable signal and a capture clock enable signal for the clock gating devices 610 in their own circuit blocks. Under this arrangement, the circuit blocks 620 and 630 can be tested independently even though they are driven by a same clock source in clock mesh architecture.

Figure 7:
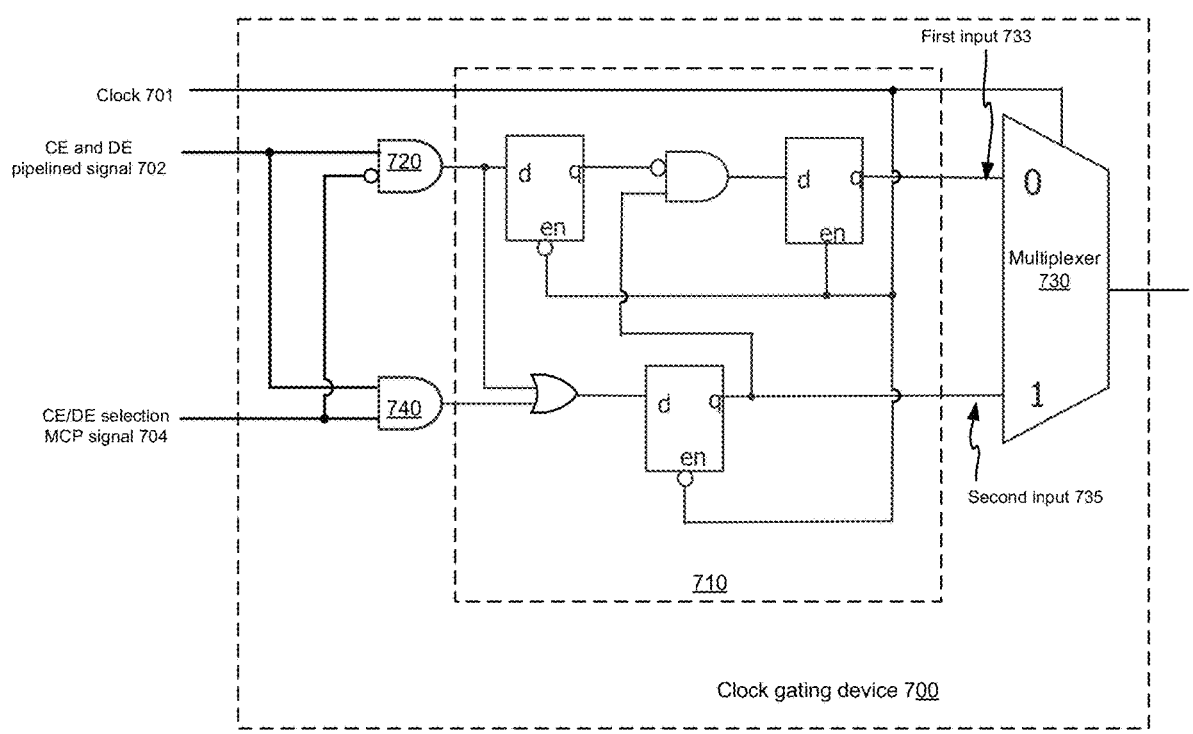
FIG. 7 illustrates an example of a clock gating device having smaller footprint than the clock gating device shown in FIG. 5 according to various embodiments of the disclosed technology.

FIG. 7 illustrates an example of a clock gating device 700 having smaller footprint than the clock gating device 500 in FIG. 5 according to various embodiments of the disclosed technology. The clock gating device 700 comprises a multiplexing device 730, a device 710 for generating input signals for the multiplexing device 730, and two AND gates 720 and 740. The device 710 is shown to have the same topology as the device 310 shown in FIG. 3. It should be noted, however, that a device different from the device 310 may be employed here as long as it can follow the truth table 360 shown in FIG. 3 and ensure that the first input signal 733 does not change when the selector input of the multiplexing device 730 is at "0" and that the second input signal 735 does not change when the selector input of the multiplexing device 730 is at "1".

Unlike the clock gating device 500, the clock gating device 700 does not have a device similar to the circuitry for generating CE/DE signals 560. Instead, the CE and DE signals for the device 710 are delivered through a single pipeline path, referred to as a CE and DE pipelined signal 702. This is feasible because the CE and DE signals do not need to be changed in the same time. A CE/DE selection MCP signal 704 is used to decouple the CE and DE signals from the CE and DE pipelined signal 702 using the two AND gates 720 and 740. As the name suggests, the CE/DE selection MCP signal 704 can be send through a multicycle path. This architecture reduces pipeline devices needed.

The clock gating device 700 can be used to implement the clock gating devices 610 shown in FIG. 6. However, a device for generating the CE and DE pipelined signal 702 and the CE/DE selection MCP signal 704 based on the shift clock enable signal and the capture clock enable signal needs to be inserted into each of the circuit blocks 620 and 630.

Figure 8:
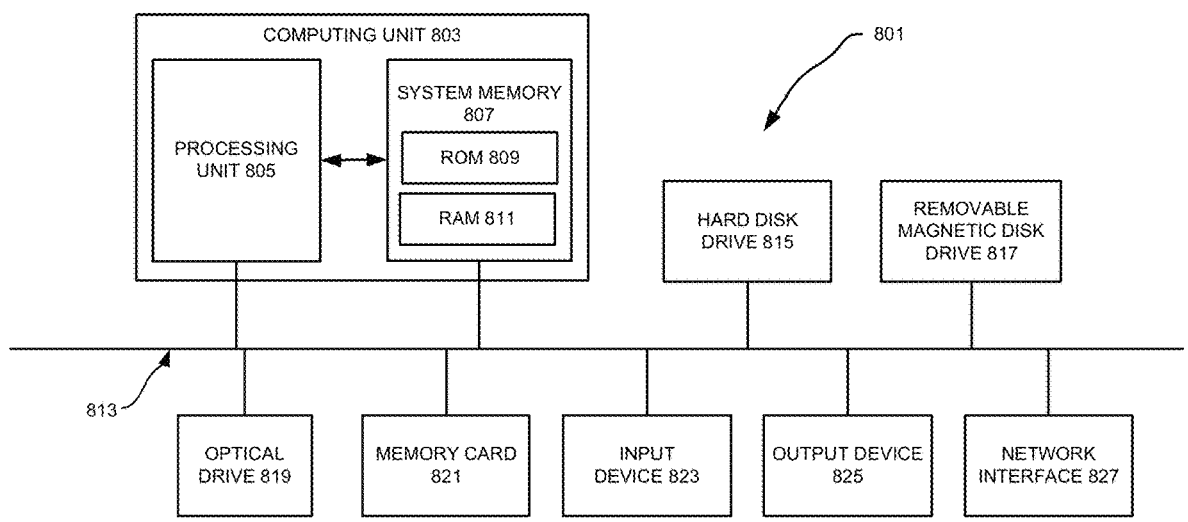
FIG. 8 illustrates a programmable computer system with which various embodiments of the disclosed technology may be employed.

Various examples of the disclosed technology may be implemented through the execution of software instructions by a computing device, such as a programmable computer. Accordingly, FIG. 8 shows an illustrative example of a computing device 801. As seen in this figure, the computing device 801 includes a computing unit 803 with a processing unit 805 and a system memory 807. The processing unit 805 may be any type of programmable electronic device for executing software instructions, but it will conventionally be a microprocessor. The system memory 807 may include both a read-only memory (ROM) 809 and a random access memory (RAM) 811. As will be appreciated by those of ordinary skill in the art, both the read-only memory (ROM) 809 and the random access memory (RAM) 811 may store software instructions for execution by the processing unit 805.

The processing unit 805 and the system memory 807 are connected, either directly or indirectly, through a bus 813 or alternate communication structure, to one or more peripheral devices. For example, the processing unit 805 or the system memory 807 may be directly or indirectly connected to one or more additional memory storage devices, such as a "hard" magnetic disk drive 815, a removable magnetic disk drive 817, an optical disk drive 819, or a flash memory card 821. The processing unit 805 and the system memory 807 also may be directly or indirectly connected to one or more input devices 823 and one or more output devices 825. The input devices 823 may include, for example, a keyboard, a pointing device (such as a mouse, touchpad, stylus, trackball, or joystick), a scanner, a camera, and a microphone. The output devices 825 may include, for example, a monitor display, a printer and speakers. With various examples of the computer 801, one or more of the peripheral devices 815-825 may be internally housed with the computing unit 803. Alternately, one or more of the peripheral devices 815-825 may be external to the housing for the computing unit 803 and connected to the bus 813 through, for example, a Universal Serial Bus (USB) connection.

With some implementations, the computing unit 803 may be directly or indirectly connected to one or more network interfaces 827 for communicating with other devices making up a network. The network interface 827 translates data and control signals from the computing unit 803 into network messages according to one or more communication protocols, such as the transmission control protocol (TCP) and the Internet protocol (IP). Also, the interface 827 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 801 is illustrated as an example only, and it is not intended to be limiting. Various embodiments of the disclosed technology may be implemented using one or more computing devices that include the components of the computer 801 illustrated in FIG. 8, which include only a subset of the components illustrated in FIG. 8, or which include an alternate combination of components, including components that are not shown in FIG. 8. For example, various embodiments of the disclosed technology may be implemented using a multiprocessor computer, a plurality of single and/or multiprocessor computers arranged into a network, or some combination of both.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:
1. A circuit, comprising:
 a clock gating device, comprising:
  a multiplexing device, wherein a selector input of the multiplexing device is coupled to a clock signal; and circuitry for generating multiplexer input signals configured to generate, and to send to inputs of the multiplexing device, a first input signal which keeps at "0" or "1" when the selector input is at "0" and a second input signal which keeps at "0" or "1" when the selector input is at "1", wherein the circuitry for generating multiplexer input signals generates the first input signal and the second input signal based on a third signal, a fourth signal and the clock signal, and wherein the clock gating device is configurable to output, based on the third signal and the fourth signal, clock pulses following the clock signal, one or more pulses with pulse width and location controlled by one or both of the third signal and the fourth signal, or both in different time periods.

2. The circuit recited in claim 1, wherein the circuitry for generating multiplexer input signals receives two signals, a shift clock enable signal and a capture clock enable signal, and generates the first input signal and the second input signal based at least in part on the shift clock enable signal and the capture clock enable signal, and wherein the multiplexing device outputs a signal comprising clock pulses for scan shift and scan capture, respectively.

3. The circuit recited in claim 1, wherein the circuitry for generating multiplexer input signals comprises logic gates and latches, and wherein the output of the multiplexing follows the clock signal when the third signal is at "1" and the fourth signal is at either "0" or "1", is at "0" when both the third signal and the fourth signal are at "0", and is at "1" when the third signal is at "0" and the fourth signal are at "1".

4. The circuit recited in claim 3, further comprising:
a device configured to generate the third signal and the fourth signal based on scan clock control signals, the scan clock control signals comprising a shift clock enable signal and a capture clock enable signal.

5. The circuit recited in claim 4, wherein the device is in the clock gating device.

6. The circuit recited in claim 4, wherein the device is outside of the clock gating device and supplies the third signal and the fourth signal to multiple instances of the clock gating device in the circuit.

7. The circuit recited in claim 1, further comprising:
a plurality of circuit blocks, and
clock mesh circuitry configured to provide the clock signal to each of the plurality of circuit blocks through a plurality of clock entry points,
wherein each of the plurality of clock entry points is coupled to an instance of the clock gating device directly or indirectly.

8. One or more non-transitory computer-readable media storing computer-executable instructions for causing a computer to perform a method, the method comprising:
creating a clock gating device in a circuit design, the clock gating device comprising:
a multiplexing device, wherein a selector input of the multiplexing device is coupled to a clock signal; and
circuitry for generating multiplexer input signals configured to generate, and to send to inputs of the multiplexing device, a first input signal which keeps at "0" or "1" when the selector input is at "0" and a second input signal which keeps at "0" or "1" when the selector input is at "1", wherein the circuitry for generating multiplexer input signals generates the first input signal and the second input signal based on a third signal, a fourth signal and the clock signal, and wherein the clock gating device is configurable to output, based on the third signal and the fourth signal, clock pulses following the clock signal, one or more pulses with pulse width and location controlled by one or both of the third signal and the fourth signal, or both in different time periods.

9. The one or more non-transitory computer-readable media recited in claim 8, wherein the circuitry for generating multiplexer input signals receives two signals, a shift clock enable signal and a capture clock enable signal, and generates the first input signal and the second input signal based at least in part on the shift clock enable signal and the capture clock enable signal, and wherein the multiplexing device outputs a signal comprising clock pulses for scan shift and scan capture, respectively.

10. The one or more non-transitory computer-readable media recited in claim 8, wherein the circuitry for generating multiplexer input signals comprises logic gates and latches, and wherein the output of the multiplexing follows the clock signal when the third signal is at "1" and the fourth signal is at either "0" or "1", is set to "0" when both the third signal and the fourth signal are at "0", and is at "1" when the third signal is at "0" and the fourth signal are at "1".

11. The one or more non-transitory computer-readable media recited in claim 10, wherein the circuit design comprises a device configured to generate the third signal and the fourth signal based on scan clock control signals, the scan clock control signals comprising a shift clock enable signal and a capture clock enable signal.

12. The one or more non-transitory computer-readable media recited in claim 11, wherein the device is in the clock gating device.

13. The one or more non-transitory computer-readable media recited in claim 11, wherein the device is outside of the clock gating device and supplies the third signal and the fourth signal to multiple instances of the clock gating device in the circuit.

14. The one or more non-transitory computer-readable media recited in claim 8, wherein the circuit design comprises:
a plurality of circuit blocks, and
clock mesh circuitry configured to provide the clock signal to each of the plurality of circuit blocks through a plurality of clock entry points,
wherein each of the plurality of clock entry points is coupled to an instance of the clock gating device directly or indirectly.

\* \* \* \* \*